US011837512B2

(12) United States Patent
Kwon

(10) Patent No.: US 11,837,512 B2
(45) Date of Patent: Dec. 5, 2023

(54) RESISTANCE PATTERNS FOR AN ON-DIE EPM

(71) Applicant: SK hynix Inc., Icheon-si (KR)

(72) Inventor: Oh Kyu Kwon, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 164 days.

(21) Appl. No.: 17/462,118

(22) Filed: Aug. 31, 2021

(65) Prior Publication Data
US 2022/0301953 A1 Sep. 22, 2022

(30) Foreign Application Priority Data

Mar. 17, 2021 (KR) .................. 10-2021-0034733

(51) Int. Cl.
*H01L 21/66* (2006.01)
*H01L 23/522* (2006.01)
(52) U.S. Cl.
CPC ............. *H01L 22/34* (2013.01); *H01L 22/32* (2013.01); *H01L 23/5226* (2013.01); *H01L 23/5228* (2013.01)
(58) Field of Classification Search
CPC .................................................. H01L 22/34
USPC ......................................................... 257/48
See application file for complete search history.

(56) References Cited

U.S. PATENT DOCUMENTS

2005/0017746 A1* 1/2005 Matsumoto ........ G01R 31/2884
324/762.05
2011/0019494 A1* 1/2011 Tsuda .................. H01L 23/5256
257/E21.531

FOREIGN PATENT DOCUMENTS

KR 10-1707931 B1 2/2017

* cited by examiner

*Primary Examiner* — Ajay Arora

(57) ABSTRACT

A semiconductor device includes: a first resistance chain including first upper resistance segments, first resistance via plugs, and first lower resistance segments; a second resistance chain including second upper resistance segments, second resistance via plugs, and second lower resistance segments; and a third resistance chain including third upper resistance segments, third resistance via plugs, and third lower resistance segments, wherein the first upper resistance segments have a first upper effective resistance distance, and the second upper resistance segments have a second upper effective resistance distance, and the third upper resistance segments have a third upper effective resistance distance, and the first upper effective resistance distance is equal to the third upper effective resistance distance, and the second upper effective resistance distance is an integer multiple of the first upper effective resistance distance.

20 Claims, 14 Drawing Sheets

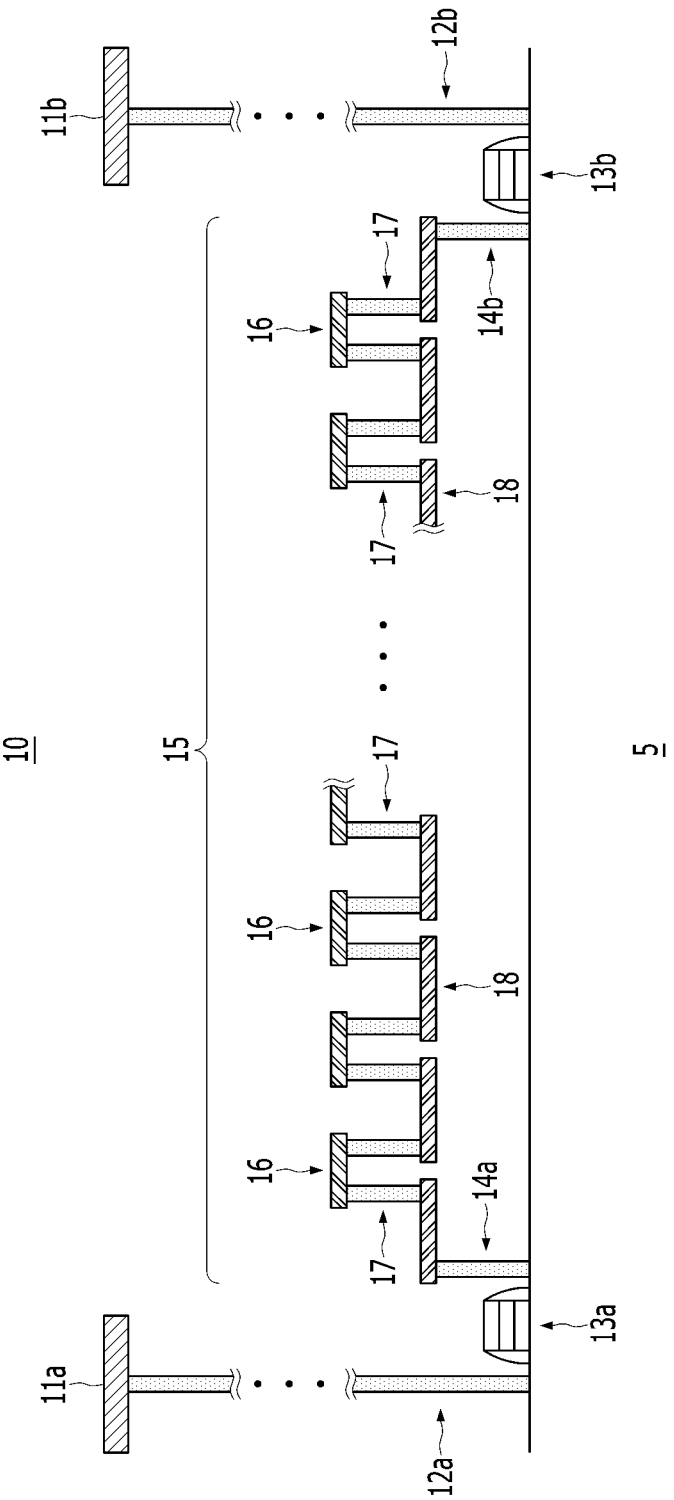

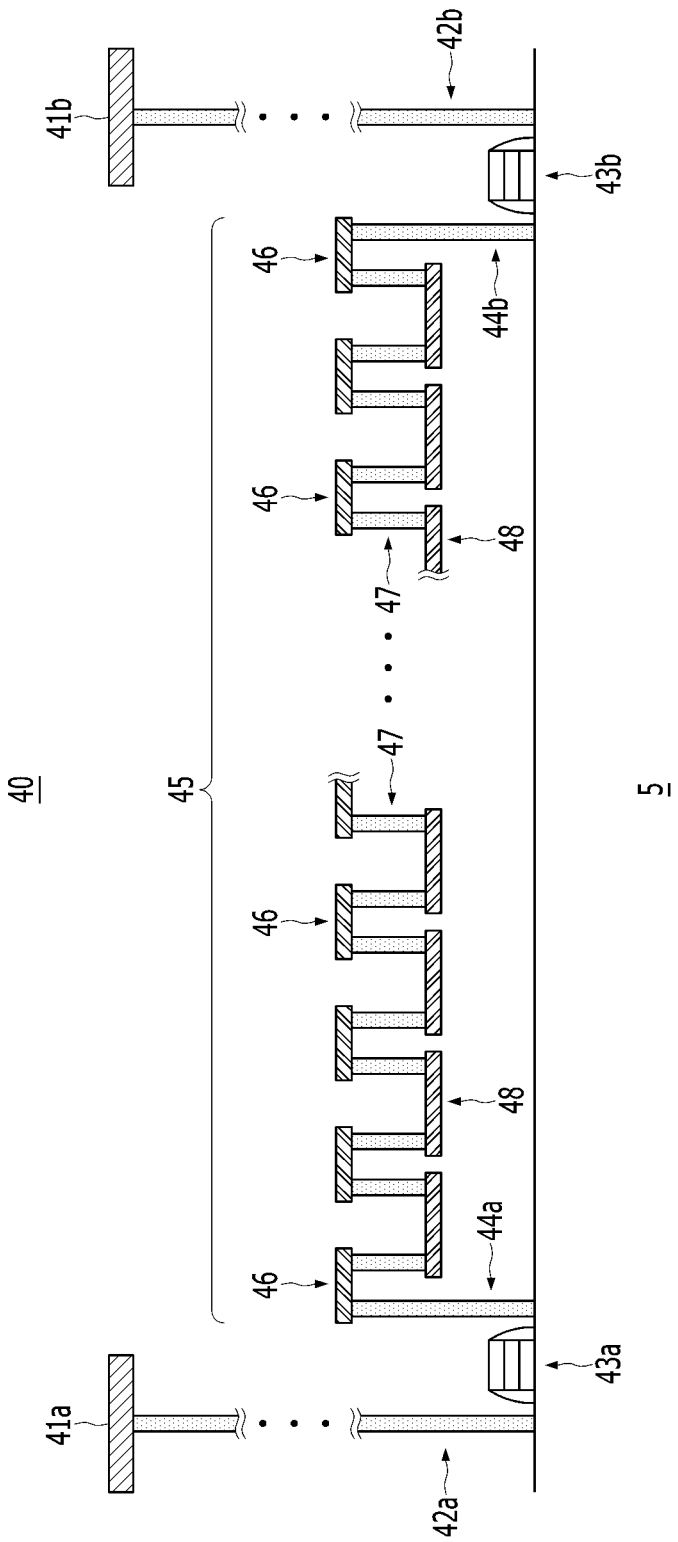

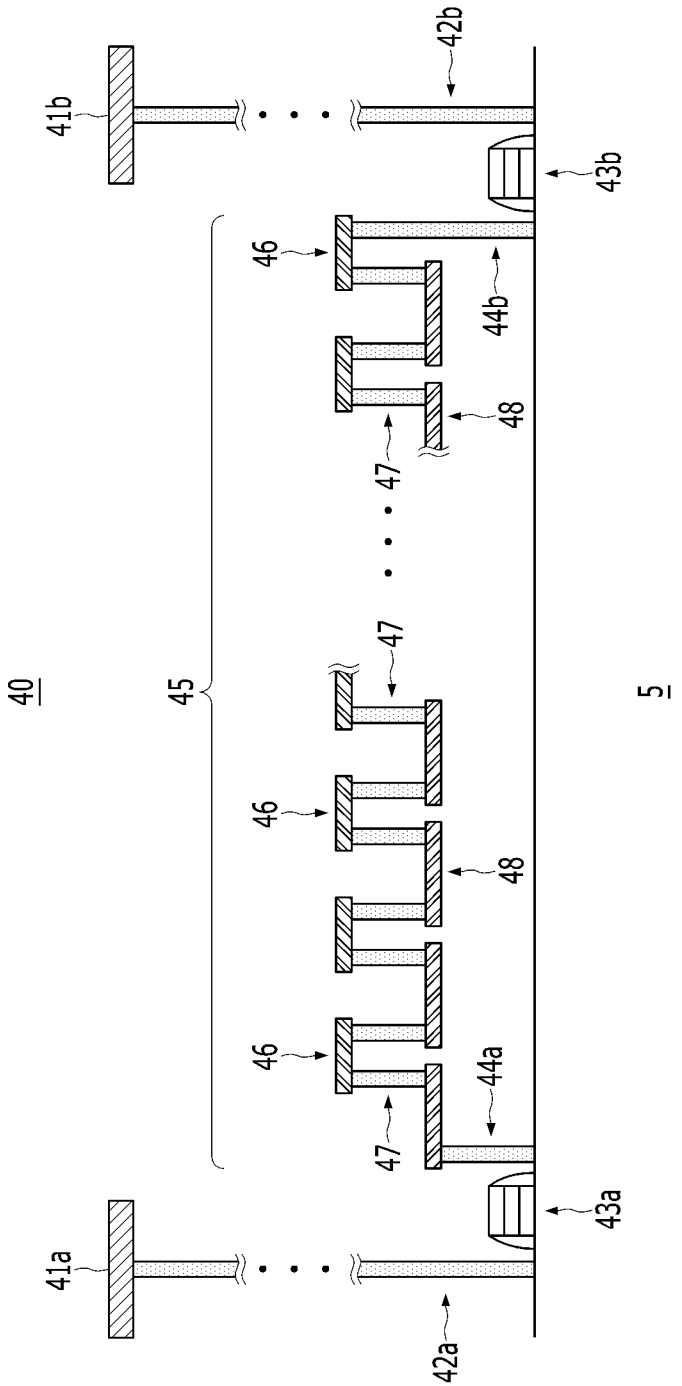

RESISTANCE PATTERNS FOR AN ON-DIE EPM

CROSS-REFERENCE TO RELATED APPLICATIONS

The present application claims priority under 35 U.S.C. § 119(a) to Korean Patent Application No. 10-2021-0034733, filed on Mar. 17, 2021, which is incorporated herein by reference in its entirety.

BACKGROUND

1. Field

Exemplary embodiments of the present invention relate to resistance patterns for On-Die Electronic Parameter Monitor (EPM).

2. Description of the Related Art

On-Die Electronic Parameter Monitor (EPM) is a series of inspection processes of measuring characteristics, capacitance, resistance and the like of transistors in a die by using diverse test patterns. On-die EPM is performed to predict electrical characteristics, operation, and performance of a semiconductor chip by using patterns positioned inside a semiconductor chip.

SUMMARY

Embodiments of the present invention are directed to a semiconductor device with resistance patterns capable of measuring accurate on-die Electronic Parameter Monitor (EPM).

In accordance with an embodiment of the present disclosure, a semiconductor device includes: a first resistance chain including first upper resistance segments, first resistance via plugs, and first lower resistance segments; a second resistance chain including second upper resistance segments, second resistance via plugs, and second lower resistance segments; and a third resistance chain including third upper resistance segments, third resistance via plugs, and third lower resistance segments, wherein the first upper resistance segments have a first upper effective resistance distance, and the second upper resistance segments have a second upper effective resistance distance, and the third upper resistance segments have a third upper effective resistance distance, and the first upper effective resistance distance is equal to the third upper effective resistance distance, and the second upper effective resistance distance is an integer multiple of the first upper effective resistance distance.

In accordance with another embodiment of the present disclosure, a semiconductor device includes: a first resistance chain including first upper resistance segments, first resistance via plugs, and first lower resistance segments; a second resistance chain including second upper resistance segments, second resistance via plugs, and second lower resistance segments; and a third resistance chain including third upper resistance segments, third resistance via plugs, and third lower resistance segments, wherein the total number of the first upper resistance segments, the total number of the second upper resistance segments, and the total number of the third upper resistance segments are the same, and the total number of the first lower resistance segments, the total number of the second lower resistance segments, and the total number of the third lower resistance segments are the same, and the total number of the first resistance via plugs, the total number of the second resistance via plugs, and the total number of the third resistance via plugs are the same.

In accordance with yet another embodiment of the present disclosure, a semiconductor device includes: a first resistance chain including first upper resistance segments having a first upper effective resistance distance, first resistance via plugs having a first via effective resistance distance, and first lower resistance segments having a first lower effective resistance distance; a second resistance chain including second upper resistance segments having a second upper effective resistance distance, second resistance via plugs having a second via effective resistance distance, and second lower resistance segments having a second lower effective resistance distance; and a third resistance chain including third upper resistance segments having a third upper effective resistance distance, third resistance via plugs having a third via effective resistance distance, and third lower resistance segments having a third lower effective resistance distance, wherein a total length of the second resistance chain is longer than a total length of the first resistance chain by a sum of the first upper effective resistance distances of the first upper resistance segments, and a total length of the third resistance chain is longer than the total length of the first resistance chain by a sum of the first lower effective resistance distances of the first lower resistance segments.

BRIEF DESCRIPTION OF THE DRAWINGS

FIG. 2A is a longitudinal cross-sectional view schematically illustrating a first resistance pattern.

FIGS. 5A and 5B are longitudinal cross-sectional views schematically illustrating a fourth resistance pattern of a semiconductor device in accordance with other embodiments of the present disclosure.

DETAILED DESCRIPTION

Figure 1:
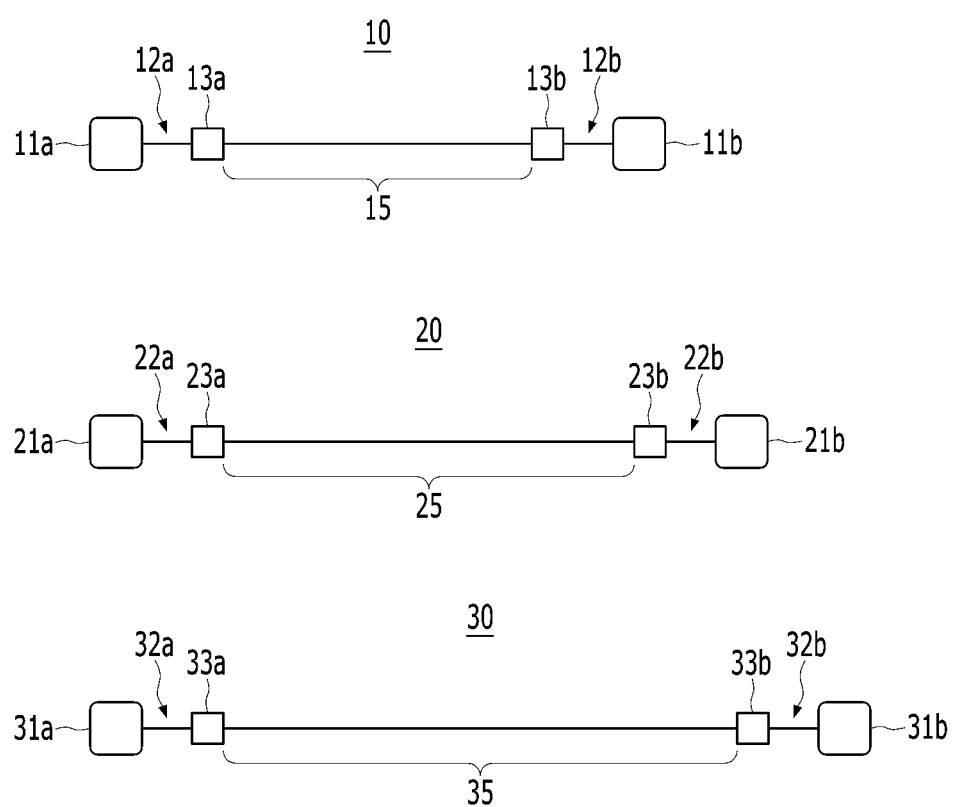
FIG. 1 is a block diagram schematically illustrating resistance patterns of a semiconductor device in accordance with an embodiment of the present disclosure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a one or more layers exists between the first layer and the second layer or the substrate.

FIG. 1 is a block diagram schematically illustrating resistance patterns of a semiconductor device in accordance with an embodiment of the present disclosure.

Referring to FIG. 1, a semiconductor device in accordance with the exemplary embodiment of the present document may include a first resistance pattern 10, a second resistance pattern 20, and a third resistance pattern 30.

The first resistance pattern 10 may optionally include a first front pad 11a, a first end pad 11b, a first front via 12a, a first end via 12b, a first front switch 13a, a first end switch 13b, and a first resistance chain 15. The second resistance pattern 20 may optionally include a second front pad 21a, a second end pad 21b, a second front via 22a, a second end via 22b, a second front switch 23a, a second end switch 23b, and a second resistance chain 25. The third resistance pattern 30 may optionally include a third front pad 31a, a third end pad 31b, a third front via 32a, a third end via 32b, a third front switch 33a, and a third end switch 33b, and a third resistance chain 35. Throughout this disclosure, 'front' and 'end' are terms used for convenience in order to distinguish the components, which may be interchangeable with each other.

The front pads 11a, 21a and 31a and the end pads 11b, 21b, and 31b may be any ones from among a power source pad, a ground pad, an address pad, a DQ pad, and a command pad of a semiconductor chip. In other words, on-die EPM pads 11a, 11b, 21a, 21b, 31a, and 31b may be different types of functional pads of the semiconductor chip.

As illustrated in FIG. 1, the front vias 12a, 22a and 32a and the end vias 12b, 22b and 32b may electrically connect the pads 11a, 11b, 21a, 21b, 31a and 32b and the switches 13a, 13b, 23a, 23b, 33a and 33b, respectively. For example, the first front via 12a may electrically connect the first front pad 11a and the first front switch 13a, and the first end via 12b may electrically connect the first end switch 13b and the first end pad 11b. The second front via 22a may electrically connect the second front pad 21a and the second front switch 23a, and the second end via 22b may electrically connect the second end switch 23b and the second end pad 21b. The third front via 32a may electrically connect the third front pad 31a and the third front switch 33a, and the third end via 32b may electrically connect the third end switch 33b and the third end pad 31b.

The first front switch 13a may electrically connect or electrically disconnect the first front via 12a and the first resistance chain 15 to or from each other. In other words, the first front switch 13a may electrically connect or electrically disconnect the first front pad 11a and the first resistance chain 15 to or from each other. The first end switch 13b may electrically connect or electrically disconnect the first resistance chain 15 and the first end via 12b to or from each other. In other words, the first end switch 13b may electrically connect or electrically disconnect the first resistance chain 15 and the first end pad 11b to or from each other.

The second front switch 23a may electrically connect or electrically disconnect the second front via 22a and the second resistance chain 25 to or from each other. In other words, the second front switch 23a may electrically connect or electrically disconnect the second front pad 21a and the second resistance chain 25 to or from each other. The second end switch 23b may electrically connect or electrically disconnect the second resistance chain 25 and the second end via 22b to or from each other. In other words, the second end switch 23b may electrically connect or electrically disconnect the second resistance chain 25 and the second end pad 21b to or from each other.

The third front switch 33a may electrically connect or electrically disconnect the third front via 32a and the third resistance chain 35 to or from each other. In other words, the third front switch 33a may electrically connect or electrically disconnect the third front pad 31a and the third resistance chain 35 to or from each other. The third end switch 33b may electrically connect or electrically disconnect the third resistance chain 35 and the third end via 32b to or from each other. In other words, the third end switch 33b may electrically connect or electrically disconnect the third resistance chain 35 and the third end pad 31b to or from each other.

According to an embodiment of the present disclosure, the total length of the second resistance chain 25 may be longer than the total length of the first resistance chain 15. Also, the total length of the third resistance chain 35 may be longer than the total length of the second resistance chain 25.

Figure 2B:
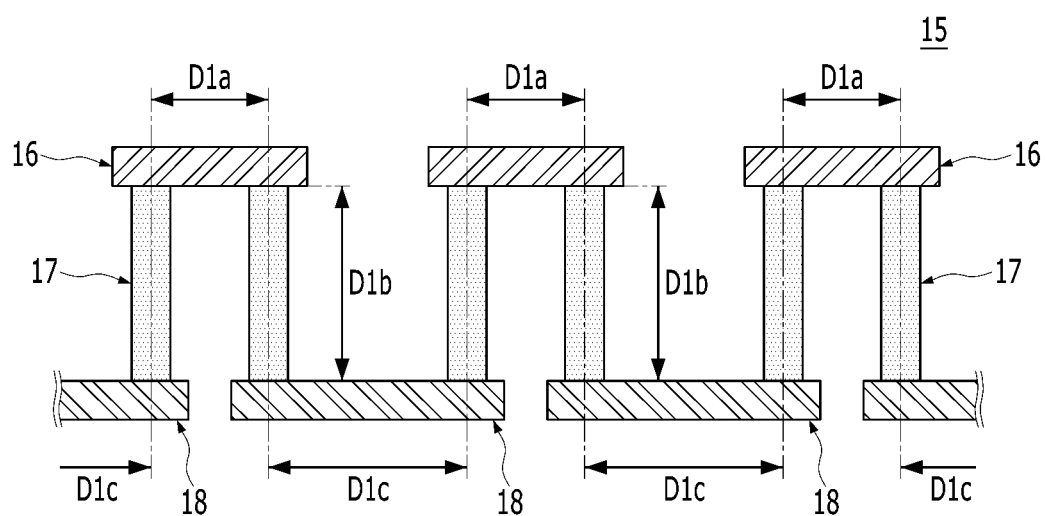
FIG. 2B is an enlarged view of a portion of FIG. 2A to explain a first resistance chain.
Figure 2C:
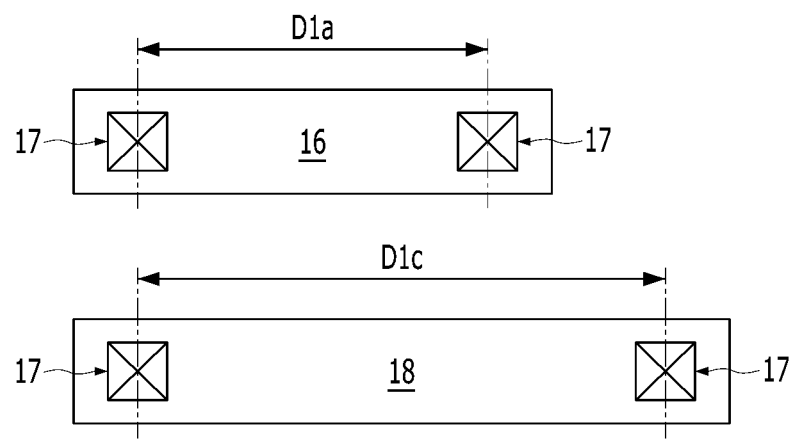
FIG. 2C is a layout illustrating an effective resistance distance of the first resistance chain.

FIG. 2A is a longitudinal cross-sectional view schematically illustrating a first resistance pattern 10, and FIG. 2B is an enlarged view of a portion of FIG. 2A to explain a first resistance chain 15, and FIG. 2C is a layout illustrating an effective resistance distance of the first resistance chain 15.

Referring to FIG. 2A, the first resistance pattern 10 may include a first front pad 11a, a first end pad 11b, a first front via 12a, a first end via 12b, a first front switch 13a, a first end switch 13b, a first front switch contact 14a, a first end switch contact 14b, and a first resistance chain 15. The first front pad 11a and the first end pad 11b may be exposed on a surface of a semiconductor chip. The first front pad 11a and the first end pad 11b may be, for example, input/output pads of the semiconductor chip.

The first front via 12a may electrically connect the first front pad 11a and a substrate 5. The first front via 12a may have a vertical column shape. The first front switch 13a may include a MOS transistor. For example, the first front via 12a may electrically connect the first front pad 11a and a source electrode of the MOS transistor. The first front switch contact 14a may electrically connect the first front switch 13a and the first resistance chain 15. For example, the first front switch contact 14a may electrically connect a drain electrode of the MOS transistor and the first resistance chain

15. The first front switch 13*a* may perform an on/off operation to electrically connect or electrically disconnect the first front via 12*a* and the first front switch contact 14*a* to or from each other. Accordingly, the first front switch 13*a* may electrically connect or electrically disconnect the first front pad 11*a* and the first resistance chain 15 to or from each other.

The first end via 12*b* may electrically connect the substrate 5 and the first end pad 11*b*. The first end via 12*b* may have a vertical column shape. The first end switch 13*b* may include a MOS transistor. For example, the first end via 12*b* may electrically connect a source electrode of the MOS transistor and the first end pad 11*b*. The first end switch contact 14*b* may electrically connect the first resistance chain 15 and the first end switch 13*b*. For example, the first end switch contact 14*b* may electrically connect the first resistance chain 15 and a drain electrode of the MOS transistor. The first end switch 13*b* may perform an on/off operation to electrically connect or electrically disconnect the first end switch contact 14*b* and the first end via 12*b* to or from each other. Accordingly, the first end switch 13*b* may electrically connect or electrically disconnect the first resistance chain 15 and the first end pad 11*b* to or from each other.

The first resistance chain 15 may include first upper resistance segments 16, first resistance via plugs 17, and first lower resistance segments 18, which are coupled in a chain form. The first upper resistance segments 16 and the first lower resistance segments 18 may have a shape of a horizontally extending bar or segment. The first resistance via plugs 17 may have a pillar shape. For example, the first upper resistance segments 16 may correspond to an upper metal wiring layer, and the first resistance via plugs 17 may correspond to inter-metallic vias, and the first lower resistance segments 18 may correspond to a lower metal wiring layer.

Referring to FIGS. 2B and 2C, in the first upper resistance segment 16, the first upper effective resistance distance D1*a* between the centers of the regions contacting and coupled to the first resistance via plugs 17 may be the same. Accordingly, the first upper resistance segments 16 may have the same first upper effective resistance value. All of the first resistance via plugs 17 may have the same first via effective resistance distance D1*b*. For example, all of the first resistance via plugs 17 may have the same vertical height and horizontal width. Accordingly, the first resistance via plugs 17 may have the same first via effective resistance value. In the first lower resistance segments 18, the first lower effective resistance distance D1*c* between the centers of the regions contacting and coupled to the first resistance via plugs 17 may be the same. Accordingly, the first lower resistance segments 18 may have the same first lower effective resistance value. The first upper effective resistance distance D1*a* and the first lower effective resistance distance D1*c* may be set independently. The effective resistance values may mean the actual resistance values of a portion that contributes as a resistance component in an electrical connection.

Figure 3A:
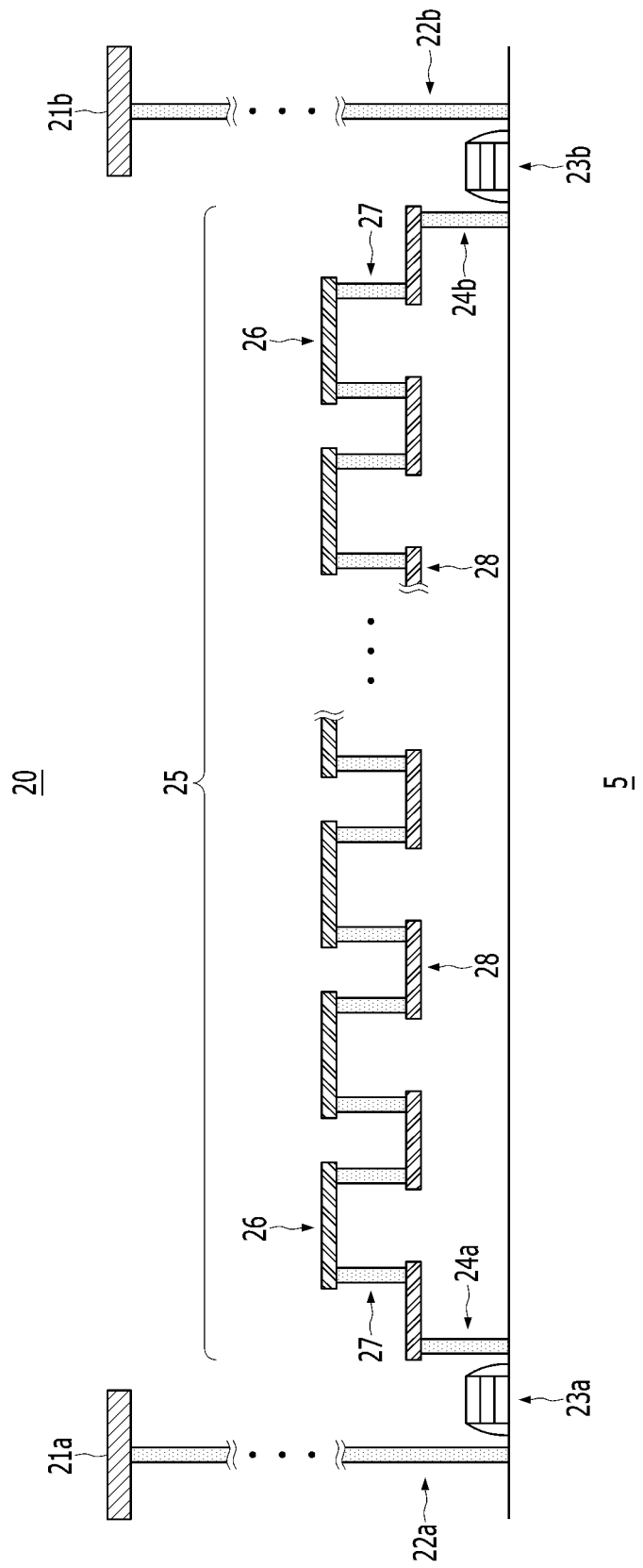
FIG. 3A is a longitudinal cross-sectional view schematically illustrating a second resistance pattern.
Figure 3B:
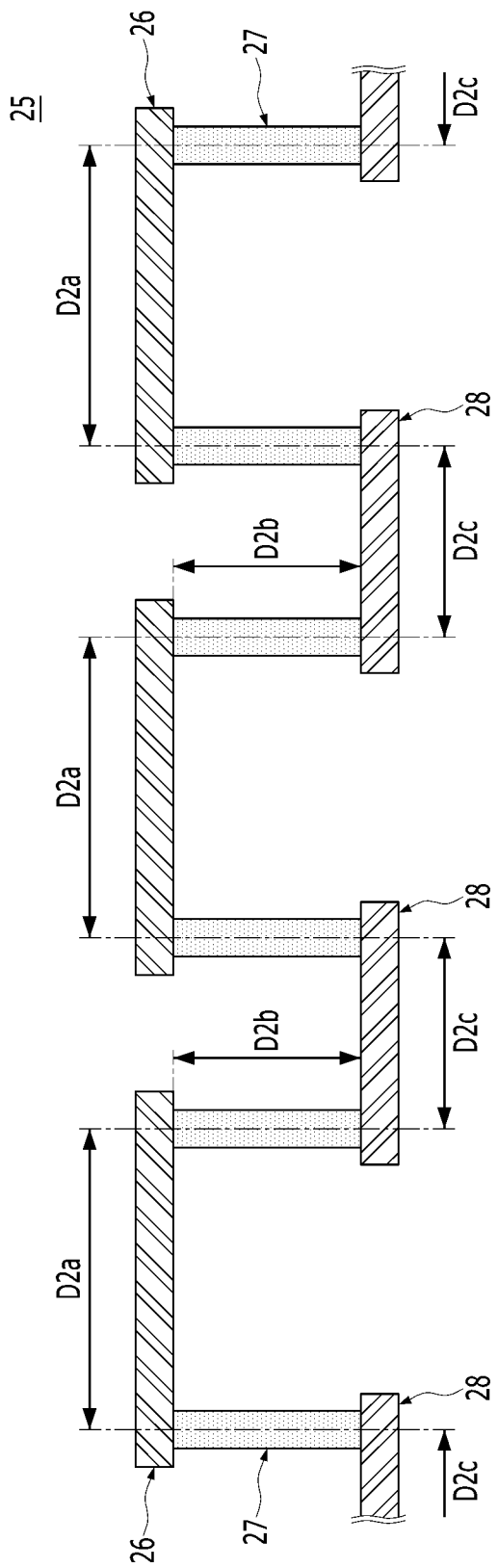
FIG. 3B is an enlarged view of a portion of FIG. 3A to explain a second resistance chain.
Figure 3C:
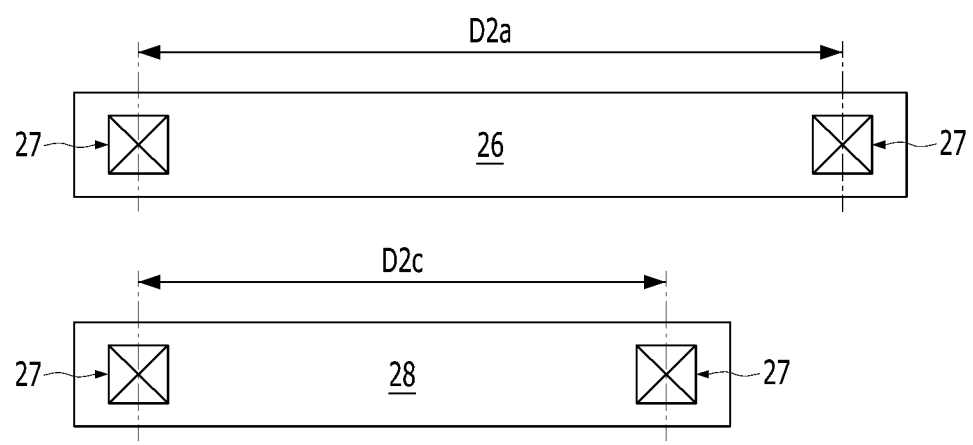
FIG. 3C is a layout illustrating an effective resistance distance of the second resistance chain.

FIG. 3A is a longitudinal cross-sectional view schematically illustrating a second resistance pattern 20, and FIG. 3B is an enlarged view of a portion of FIG. 3A to explain a second resistance chain 25, and FIG. 3C is a layout illustrating an effective resistance distance of the second resistance chain.

Referring to FIG. 3A, the second resistance pattern 20 may include a second front pad 21*a*, a second end pad 21*b*, a second front via 22*a*, a second end via 22*b*, and a second front switch 23*a*, a second end switch 23*b*, a second front switch contact 24*a*, a second end switch contact 24*b*, and a second resistance chain 25. The second front pad 21*a*, the second end pad 21*b*, the second front via 22*a*, the second end via 22*b*, the second front switch 23*a*, the second end switch 23*b*, the second front switch contact 24*a*, and the second end switch contact 24*b* may be understood by referring to the first front pad 11*a*, the first end pad 11*b*, the first front via 12*a*, the first end via 12*b*, the first front switch 13*a*, the first end switch 13*b*, the first front switch contact 14*a*, and the first end switch contact 14*b* shown in FIGS. 2A to 2C.

The second resistance chain 25 may include second upper resistance segments 26, second resistance via plugs 27, and second lower resistance segments 28, which are coupled in a chain form. The second upper resistance segments 26 and the second lower resistance segments 28 may have a shape of a horizontally extending bar or segment. The second resistance via plugs 27 may have a pillar shape. For example, the second upper resistance segments 26 may correspond to an upper metal wiring layer, and the second resistance via plugs 27 may correspond to inter-metallic vias, and the second lower resistance segments 28 may correspond to a lower metal wiring layer. Accordingly, referring to FIG. 2A and FIG. 3A, the first upper resistance segments 16 and the second upper resistance segments 26 may be formed at the same level, and the first resistance via plugs 17 and the second resistance via plugs 27 may be formed at the same level, and the first lower resistance segments 18 and the second lower resistance segments 28 may be formed at the same level.

Referring to FIGS. 3B and 3C, in the second upper resistance segments 26, the second upper effective resistance distance D2*a* between the centers of the regions contacting and coupled to the second resistance via plugs 27 may be the same. Accordingly, all of the second upper resistance segments 26 may have the same second upper effective resistance value. All of the second resistance via plugs 27 may have the same second via effective resistance distance D2*b*. For example, all of the second resistance via plugs 27 may have the same vertical height and horizontal width. Accordingly, the second resistance via plugs 27 may have the same second via effective resistance value. The first resistance via plugs 17 of FIGS. 2B and 2C and the second resistance via plugs 27 may have the same dimensions. Accordingly, the first via effective resistance value of the first resistance via plugs 17 and the second via effective resistance value of the second resistance via plugs 27 may be the same. In the second lower resistance segments 28, the first lower effective resistance distance D2*c* between the centers of the regions contacting and coupled to the second resistance via plugs 27 may be the same. Accordingly, all of the second lower resistance segments 28 may have the same second lower effective resistance value. The second upper effective resistance distance D2*a* and the second lower effective resistance distance D2*c* may be set independently.

In an embodiment, the second upper effective resistance distance D2*a* may be twice the first upper effective resistance distance D1*a*. Accordingly, the second upper effective resistance value of the second upper resistance segments 26 may be twice that of the first upper effective resistance value of the first upper resistance segments 16. The first lower effective resistance distance D1*c* and the second lower effective resistance distance D2*c* may be the same. Accordingly, the first lower effective resistance value of the first lower resistance segments 18 and the second lower effective resistance value of the second lower resistance segments 28 may be the same.

Figure 4A:
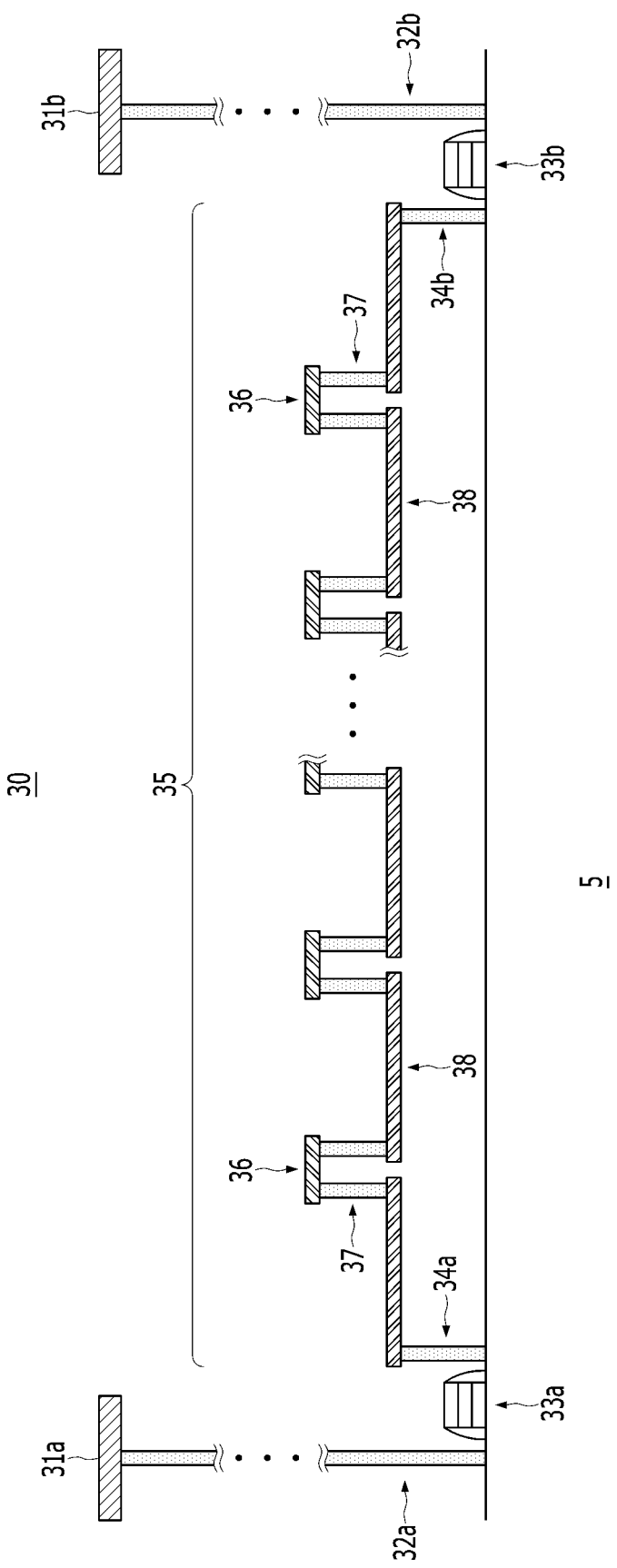
FIG. 4A is a longitudinal cross-sectional view schematically illustrating a third resistance pattern.
Figure 4B:
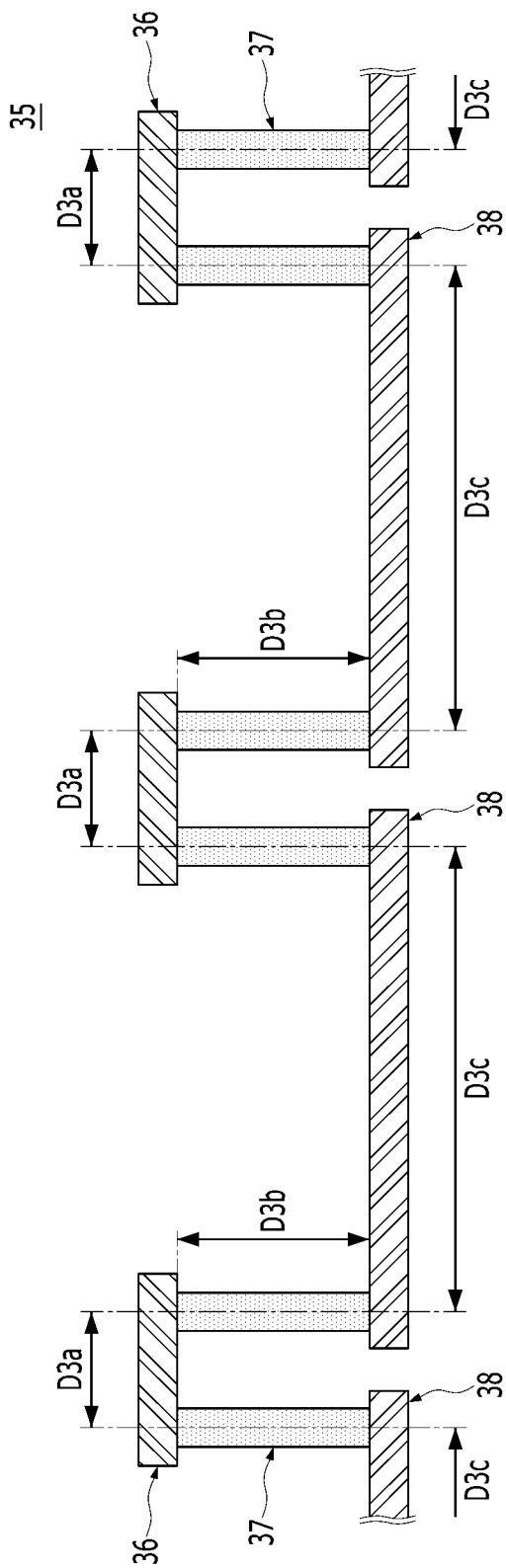
FIG. 4B is an enlarged view of a portion of FIG. 4A to explain a third resistance chain.
Figure 4C:
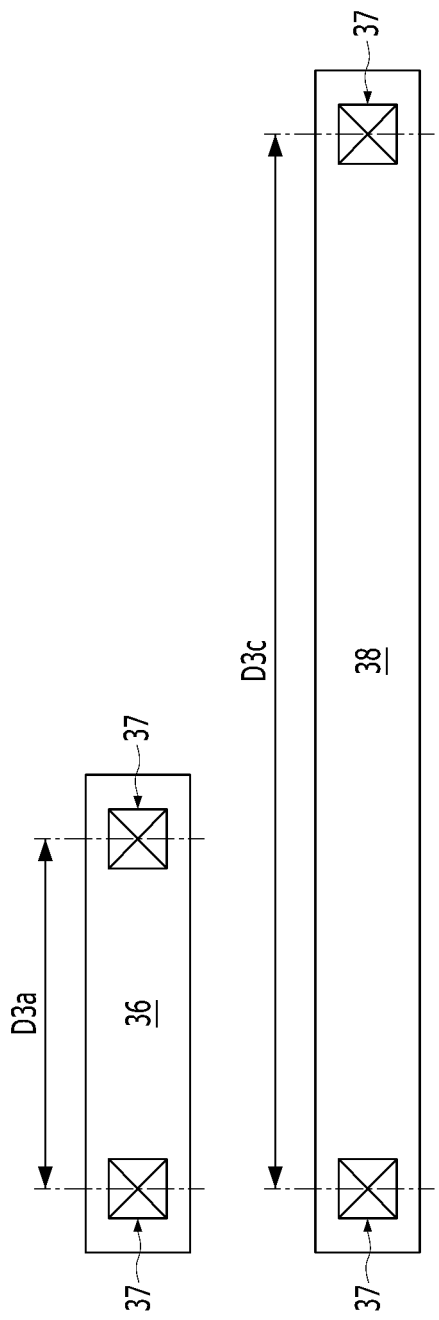
FIG. 4C is a layout illustrating an effective resistance distance of a third resistance chain.

FIG. 4A is a longitudinal cross-sectional view schematically illustrating a third resistance pattern 30, and FIG. 4B is an enlarged view of a portion of FIG. 4A to explain a third resistance chain 35, and FIG. 4C is a layout illustrating an effective resistance distance of a third resistance chain 35.

Referring to FIG. 4A, the third resistance pattern 30 may include a third front pad 31a, a third end pad 31b, a third front via 32a, a third end via 32b, a third front switch 33a, a third end switch 33b, a third front switch contact 34a, a third end switch contact 34b, and a third resistance chain 35. The third front pad 31a, the third end pad 31b, the third front via 32a, the third end via 32b, the third front switch 33a, the third end switch 33b, the third front switch contact 34a, and the third end switch contact 34b may be understood by referring to the first front pad 11a, the first end pad 11b, the first front via 12a, the first end via 12b, the first front switch 13a, the first end switch 13b, the first front switch contact 14a, and the first end switch contact 14b shown in FIGS. 2A to 2C.

The third resistance chain 35 may include third upper resistance segments 36, third resistance via plugs 37, and third lower resistance segments 38, which are coupled in a chain form. The third upper resistance segments 36 and the third lower resistance segments 38 may have a shape of a horizontally extending bar or segment. The third resistance via plugs 37 may have a pillar shape. For example, the third upper resistance segments 36 may correspond to an upper metal wiring layer, the third resistance via plugs 37 may correspond to inter-metallic vias, and the third lower resistance segments 38 may correspond to a lower metal wiring layer. Accordingly, referring to FIGS. 2A, 3A and 4A, the first upper resistance segments 16, the second upper resistance segments 26, and the third upper resistance segments 36 may be formed at the same level, and the first resistance via plugs 17, the second resistance via plugs 27, and the third resistance via plugs 37 may be formed at the same level, and the first lower resistance segments 18, the second lower resistance segments 28, and the third lower resistance segments 38 may be formed at the same level.

Referring to FIGS. 4B and 4C, in the third upper resistance segments 36, the third upper effective resistance distance D3a between the centers of the regions contacted and coupled to the third resistance via plugs 37 may be the same. Accordingly, all of the third upper resistance segments 36 may have the same third upper effective resistance value. All of the third resistance via plugs 37 may have the same third via effective resistance distance D3b. For example, all of the third resistance via plugs 37 may have the same vertical height and horizontal width. Accordingly, the third resistance via plugs 37 may have the same third via effective resistance value. The first resistance via plugs 17, the second resistance via plugs 27, and the third resistance via plugs 37 may have the same dimensions. Accordingly, the first via effective resistance values of the first resistance via plugs 17, the second via effective resistance values of the second resistance via plugs 27, and the third via effective resistance values of the third resistance via plugs 37 may be the same. In the third lower resistance segments 38, the third lower effective resistance distance D3c between the centers of the regions contacting and coupled to the third resistance via plugs 37 may be the same. Accordingly, all of the third lower resistance segments 38 may have the same third lower effective resistance value. The third upper effective resistance distance D3a and the third lower effective resistance distance D3c may be independently set.

In an embodiment, the first upper effective resistance distance D1a and the third upper effective resistance distance D3a may be the same. Accordingly, the first upper effective resistance value of the first upper resistance segments 16 and the third upper effective resistance value of the third upper resistance segments 36 may be the same. The third lower effective resistance distance D3c may be twice the first lower effective resistance distance D1c. Accordingly, the third lower effective resistance value of the third lower resistance segments 38 may be twice the first lower effective resistance value of the first lower resistance segments 18.

Referring to FIGS. 2A, 3A, and 4A, the first to third front switch contacts 14a, 24a and 34a may directly couple the first to third front switches 13a, 23a, and 33a to the ends of the foremost first to third lower resistance segments 18, 28 and 38 of the first to third resistance chains 15, 25, and 35, respectively. The first to third end switch contacts 14b, 24b and 34b may directly couple the ends of the endmost first to third lower resistance segments 18, 28 and 38 of the first to third resistance chains 15, 25 and 35 to the first to third end switches 13b, 23b and 33b, respectively. For example, the first to third front switch contacts 14a, 24a, and 34a may directly couple the substrate 5 to the ends of the foremost first to third lower resistance segments 18, 28 and 38 of the first to third resistance chains 15, 25 and 35, respectively. The first to third end switch contacts 14b, 24b, and 34b may directly couple the ends of the endmost first to third lower resistance segments 18, 28 and 38 of the first to third resistance chains 15, 25 and 35 to the substrate 5, respectively.

Referring to FIGS. 2A to 4C, the first to third upper resistance segments 16, 26, and 36 may have the same cross-sectional area. For example, in a cross-section, the first to third upper resistance segments 16, 26, and 36 may include the same vertical thickness and the same horizontal width. In addition, the first to third upper resistance segments 16, 26, and 36 may include the same material. The first to third resistance via plugs 17, 27, and 37 may have the same cross-sectional area. For example, in a cross-section, the first to third resistance via plugs 17, 27, and 37 may have the same horizontal width. The first to third lower resistance segments 18, 28 and 38 may have the same cross-sectional area. For example, in a cross-section, the first to third lower resistance segments 18, 28 and 38 may include the same vertical thickness and the same horizontal width. In addition, the first to third lower resistance segments 18, 28 and 38 may include the same material.

As mentioned above, the first upper effective resistance distance D1a of the first upper resistance segment 16 and the third upper effective resistance distance D3a of the third upper resistance segment 36 may be the same. Accordingly, the first upper effective resistance value (referred to as R1a) of the first upper resistance segment 16 and the third upper effective resistance value (referred to as R3a) of the third upper resistance segment 36 may be the same. The second upper effective resistance distance D2a of the second upper resistance segment 26 may be twice the first upper effective resistance distance D1a of the first upper resistance segment 16 and the third upper effective resistance distance D3a of the third upper resistance segment 36. Thus, the second upper effective resistance value (referred to as R2a) of the second upper resistance segment 26 may be twice the first upper effective resistance value R1a of the first upper resistance segment 16 and of the third upper effective resistance value R3a of the third upper resistance segment 36. (R1a=R3a<R2a/2, 2R1a=2R3a=R2a)

The total sum of the second upper effective resistance distances D2a of the second resistance chain 25 may be greater than the total sum of the first upper effective resistance distances D1a of the first resistance chain 15. The total sum of the first upper effective resistance distance D1a of the first resistance chain 15 and the total sum of the third upper effective resistance distance D3a of the third resistance chain 35 may be the same.

As mentioned above, the first lower effective resistance distance D1c of the first lower resistance segment 18 and the second lower effective resistance distance D2c of the second lower resistance segment 28 may be the same. Accordingly, the first lower effective resistance value (referred to as R1c) of the first lower resistance segment 18 and the second lower effective resistance value (referred to as R2c) of the second lower resistance segment 28 may be the same. The third lower effective resistance distance D3c of the third lower resistance segment 38 may be twice the first lower effective resistance distance D1c of the first lower resistance segment 18 and the second effective resistance distance D2c of the second lower resistance segment 28. Accordingly, the third lower effective resistance value (referred to as R3c) of the third lower resistance segment 38 may be twice that of the first lower effective resistance value R1c of the first lower resistance segment 18 and of the second lower effective resistance value R2c of the second lower resistance segment 28. (R1c=R2c<R3c/2, 2R1c=2R2c=R3c)

The total sum of the third lower effective resistance distances D3c of the third resistance chain 35 may be greater than the total sum of the first lower effective resistance distances D1c of the first resistance chain 15. The total sum of the first lower effective resistance distances D1c of the first resistance chain 15 and the total sum of the second lower effective resistance distances D2c of the second resistance chain 25 may be the same.

The first via effective resistance distance D1b of the first resistance via plug 17, the second via effective resistance distance D2b of the second resistance via plug 27, and the third via effective resistance distance D3b of the third resistance via plug 37 may be the same. Accordingly, the first via effective resistance value (referred to as R1b) of the first resistance via plug 17, the second via effective resistance value (referred to as R2b) of the second resistance via plug 27, and the third via effective resistance value (referred to as R3b) of the third resistance via plug 37 may be the same.

The total number of the first upper resistance segments 16 of the first resistance chain 15, the total number of the second upper resistance segments 26 of the second resistance chain 25, and the total number of the third upper resistance segments 36 of the third resistance chain 35 may be the same. The total number of the first resistance via plugs 17 of the first resistance chain 15, the total number of the second resistance via plugs 27 of the second resistance chain 25, and the total number of the third resistance via plugs 37 of the third resistance chain 35 may be the same. The total number of the first lower resistance segments 18 of the first resistance chain 15, the total number of the second lower resistance segments 28 of the second resistance chain 25, and the total number of the third lower resistance segments 38 of the third resistance chain 35 may be the same.

The total resistance value (referred to as Rt1) of the first resistance chain 15, the total resistance value (referred to as Rt2) of the second resistance chain 25, and the total resistance value (referred to as Rt3) of the third resistance chain 35 may be measured to obtain the effective resistance values R1a, R1b, R1c, R2a, R2b, R2c, R3a, R3b, and R3c of the first to third upper resistance segments 36, the first to third resistance via plugs 37, and the first to third lower resistance segments 38. Herein, when it is assumed that the first upper effective resistance value R1a is 'A', the second upper effective resistance value R2a may be '2A', and the third upper effective resistance value R3a may be 'A'. It is assumed that the first to third via effective resistance values R1b, R2b and R3b are all the same and they are 'B'. When it is assumed that the first lower effective resistance value R1c is 'C', the second lower effective resistance value R2c is 'C', and the third lower effective resistance value R3c is '2C'. When the first to third upper resistance segments 36 are L individually, and the first to third resistance via plugs 37 are M individually, and the first to third lower resistance segments 38 are N individually, the following relation may be established. Herein, L, M, and N are natural numbers.

$$Rt1 = (A \times L) + (B \times M) + (C \times N) \quad \text{①}$$

$$Rt2 = (2A \times L) + (B \times M) + (C \times N) \quad \text{②}$$

$$Rt3 = (A \times L) + (B \times M) + (2C \times N) \quad \text{③}$$

(where Rt1, Rt2, and Rt3 are measured resistance values, individually)

Resistance via plugs 17, 27 and 37 may be twice as large as the upper and lower segments 16, 18, 26, 28, 36 and 38. Therefore, when it is assumed that L and N are the same, since M is twice as large as L and N, the above equations may be simplified as follows.

$$Rt1 = n(A + 2B + C) \quad \text{①'}$$

$$Rt2 = n(2A + 2B + C) \quad \text{②'}$$

$$Rt3 = n(A + 2B + 2C) \quad \text{③'}$$

(where n is equal to L or N)

Here, 'B' may be obtained as follows.

$$B = \{(① \times 3) - (②' + ③')\}/2n$$

In other words, first to third via effective resistance values may be obtained.

When 'B' is obtained, 'A' and 'C' may also be obtained from the three equations.

Or, when '2B' is deleted from the right side of Equations ①', ②', and ③', the results are as follows.

$$Rt1' = Rt1 - n2B = n(A + C) \quad \text{①''}$$

$$Rt2' = Rt2 - n2B = n(2A + C) \quad \text{②''}$$

$$Rt3' = Rt3 - n2B = n(A + 2C) \quad \text{③''}$$

(where Rt1', Rt2', Rt3', and n2B are constant values)
Therefore, $$Rt1'/n = A + C \quad \text{①'''}$$

$$Rt2'/n = 2A + C \quad \text{②'''}$$

$$Rt3'/n = A + 2C \quad \text{③'''}$$

Rt1, Rt2, and Rt3 may be resistance values that are already known by measurement, and n2B may be a constant. Thus, Rt1', Rt2' and Rt3' are also resistance values that are already obtained. Therefore, A and C may also be calculated.

Since the values of A and C are obtained according to the above-described method, the first to third upper effective resistance values Ra1, R2a, and R3a and the first to third lower effective resistance values Rc1, Rc2, and Rc3 may be obtained. Resistance parameters of the designed conductive wirings and conductive via contacts may be accurately predicted based on the obtained effective resistance values Ra1 to Ra3, Rb1 to Rb3, and Rc1 to Rc3.

FIG. 5A is a longitudinal cross-sectional view schematically illustrating a fourth resistance pattern of a semiconductor device in accordance with another embodiment of the present disclosure. Referring to FIG. 5A, a fourth resistance pattern 40 of a semiconductor device in accordance with another embodiment of the present disclosure may include a fourth front pad 41a, a fourth end pad 41b, a fourth front via 42a, a fourth end via 42b, a fourth front switch 43a, a fourth end switch 43b, a fourth front switch contact 44a, a fourth end switch contact 44b, and a fourth resistance chain 45. Referring to FIGS. 2A through 4C, the fourth front pad 41a, the fourth end pad 41b, the fourth front via 42a, the fourth end via 42b, the fourth front switch 43a, the fourth end switch 43b, and the fourth resistance chain 45 may correspond respectively to any of the first to third front pads 11a, 21a and 31a, to any of the first to third end pads 11b, 21b, and 31b, to any of the first to third front vias 12a, 22a, and 32a, to any of the first to third end vias 12b, 22b, and 32b, to any of the first to third front switches 13a, 23a, and 33a, to any of the first to third end switches 13b, 23b, and 33b, and to any of the first to third resistance chains 15, 25, and 35. The fourth upper resistance segments 46 may correspond to any of the first to third upper resistance segments 16, 26, and 36, the fourth resistance via plugs 47 may correspond to any of the first to third resistance via plugs 17, 27, and 37, and the fourth lower resistance segments 48 may correspond to any of the first to third lower resistance segments 18, 28, and 38. For example, the fourth upper resistance segments 46 may have one among the first to third upper effective resistance distances D1a, D2a, and D3a, and thus the fourth upper resistance segments 46 may have one among the first to third upper effective resistance values. The fourth resistance plugs 47 may have one among the first to third effective via distances D1b, D2b, and D3b, and thus may have one among the first to third via effective resistance values. The fourth lower resistance segments 48 may have one among the first to third lower effective resistance distances D1c, D2c, and D3c, and thus the fourth lower resistance segments 48 may have one among the first to third lower effective resistance values.

The fourth front switch contact 44a may directly couple the substrate 5 to the frontmost fourth upper resistance segment 46 of the fourth resistance chain 45. The fourth end switch contact 44b may directly couple the endmost fourth upper resistance segment 46 of the fourth resistance chain 45 to the fourth end switch 43b.

FIG. 5B is a longitudinal cross-sectional view schematically illustrating a fourth resistance pattern of a semiconductor device in accordance with another embodiment of the present disclosure. Compared with FIG. 5A, a fourth front switch contact 44a may directly couple the substrate 5 and the foremost fourth lower resistance segment 48 of the fourth resistance chain 45. The fourth end switch contact 44b may directly couple the endmost fourth upper resistance segment 46 of the fourth resistance chain 45 to the fourth end switch 43b. Symmetrically, the fourth front switch contact 43a may directly couple the substrate 5 to one among the foremost ends of the fourth upper resistance segments 46 of the fourth resistance chain 45. The fourth end switch contact 44b may directly couple one among the endmost ends of the fourth lower resistance segments 48 of the fourth resistance chain 45 to the fourth end switch 43b.

According to embodiments of the present disclosure, accurate resistance values may be measured in on-die Electronic Parameter Monitor (EPM). Accordingly, diverse wirings of semiconductor devices may be designed accurately, and the electrical performance of the semiconductor devices may be improved.

Figure 6A:
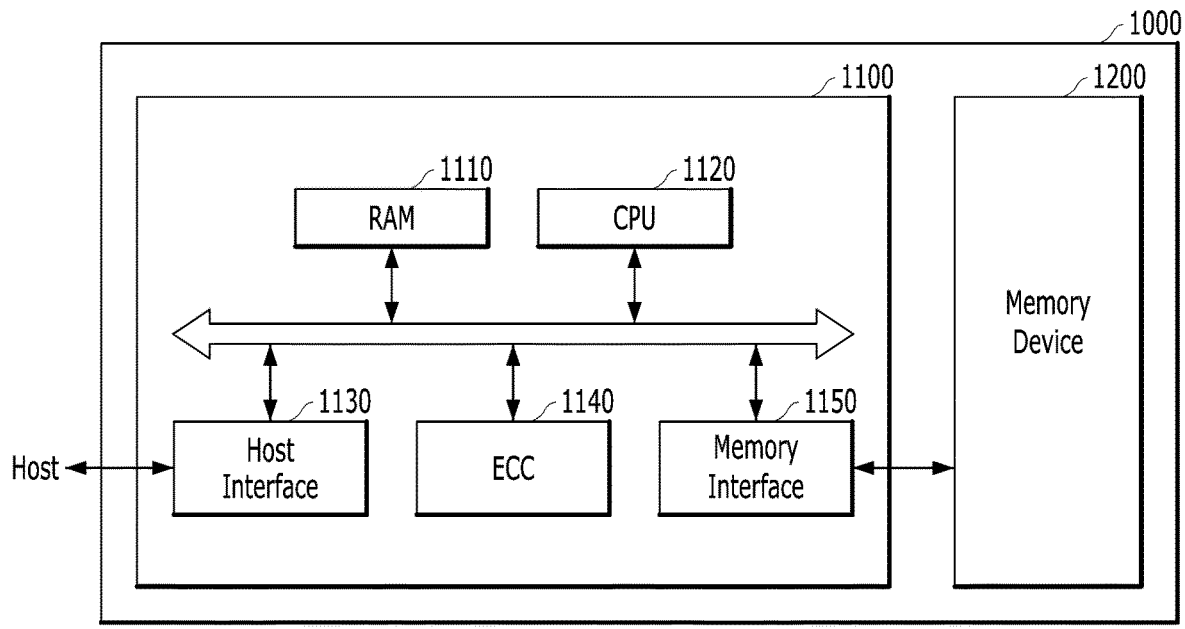
FIGS. 6A and 6B are block diagrams illustrating a configuration of memory systems according to embodiments of the present invention.

FIG. 6A is a block diagram illustrating a configuration of a memory system 1000 according to an embodiment of the present invention. Referring to FIG. 6A, a memory system 1000 according to an embodiment of the present invention may include a memory device 1200 and a controller 1100. The memory device 1200 may store data information having various data types such as text, graphics, and software codes. The memory device 1200 may include a nonvolatile memory. Also, the memory device 1200 may include the resistance patterns of a semiconductor device described with reference to FIG. 1. The controller 1100 may be connected to the host and the memory device 1200. The controller 1100 may access the memory device 1200 in response to a request from the host. For example, the controller 1100 may control operations of the memory device 1200 such as read, write, erase, and background. The controller 1100 may include, for example, a random-access memory (RAM) 1110, a central processing unit (CPU) 1120, a host interface 1130, an error correction code (ECC) circuit 1140, and a memory interface 1150. Here, the RAM 1110 may be used as an operating memory of the CPU 1120, a cache memory between the memory device 1200 and a host, a buffer memory between the memory device 1200 and a host, and the like. For reference, the RAM 1110 may be replaced with static random-access memory (SRAM), read only memory (ROM), or the like. The CPU 1120 may control the overall operation of the controller 1100. For example, the CPU 1120 may operate a firmware such as a flash translation layer (FTL) stored in the RAM 1110. The host interface 1130 may interface with a host. For example, the controller 1100 may communicate with a host through various interface protocols including at least one of USB (Universal Serial Bus) protocol, MMC (Multi-Media Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, and IDE (Integrated Drive Electronics) protocol, private protocol, and etc. The ECC circuit 1140 may detect and correct an error included in data read from the memory device 1200 using an error correction code ECC. The memory interface 1150 may interface with the memory device 1200. For example, the memory interface 1150 may include a NAND interface or a NOR interface. The buffer memory may temporarily store data transmitted to the outside through the host interface 1130 or may temporarily store data transmitted from the memory device 1200 through the memory interface 1150. In addition, the controller 1100 may further include a ROM that stores code data for interfacing with a host. As described above, the performance of the memory system 1000 may be improved because the memory system 1000 according to an embodiment of the present invention includes the memory device 1200 with improved performance.

Figure 6B:
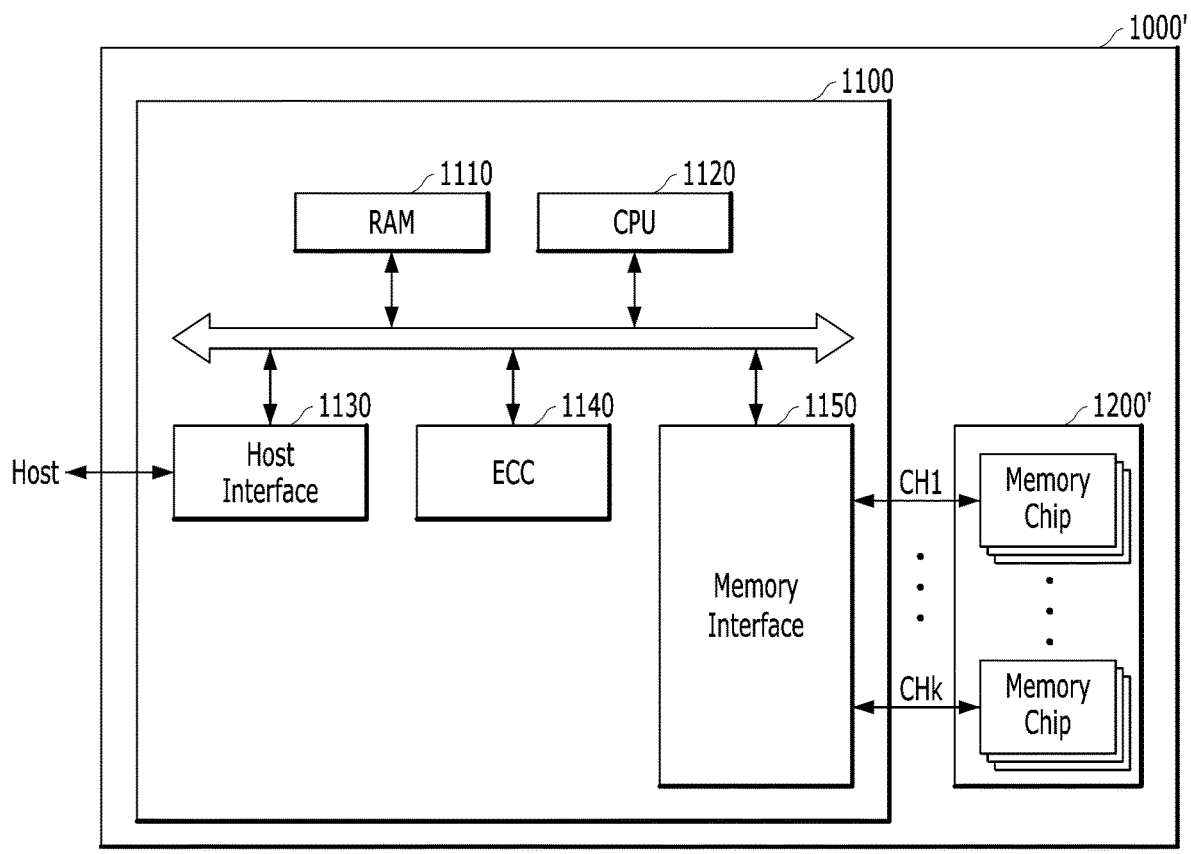

FIG. 6B is a block diagram illustrating a configuration of a memory system 1000' according to an embodiment of the present invention. Hereinafter, duplicate descriptions will be omitted below. Referring to FIG. 6B, the memory system 1000' according to an embodiment of the present invention may include a memory device 1200' and the controller 1100. In addition, the controller 1100 may include a RAM 1110, CPU 1120, host interface 1130, ECC circuit 1140, memory interface 1150, and the like. The memory device 1200' may include a nonvolatile memory. Also, the memory device 1200' may include the resistance patterns of a semiconductor device described with reference to FIG. 1. Also, the memory device 1200' may include a multi-chip package including a plurality of memory chips. The plurality of memory chips may be divided into a plurality of groups, and the plurality of groups may communicate with the controller 1100 through first to k-th channels CH1 to CHk. Also, memory chips belonging to one group may communicate with the controller 1100 through a common channel. For reference, the memory system 1000' may be modified so that one memory chip is connected to one channel. As described above, the performance of the memory system 1000' may also be improved because the memory system 1000' according to an embodiment of the present invention includes the memory device 1200' with improved performance. In particular, the memory device 1200' may have the increased data storage capacity and the improved operation speed because the memory device 1200' includes a multi-chip package.

Figure 7A:
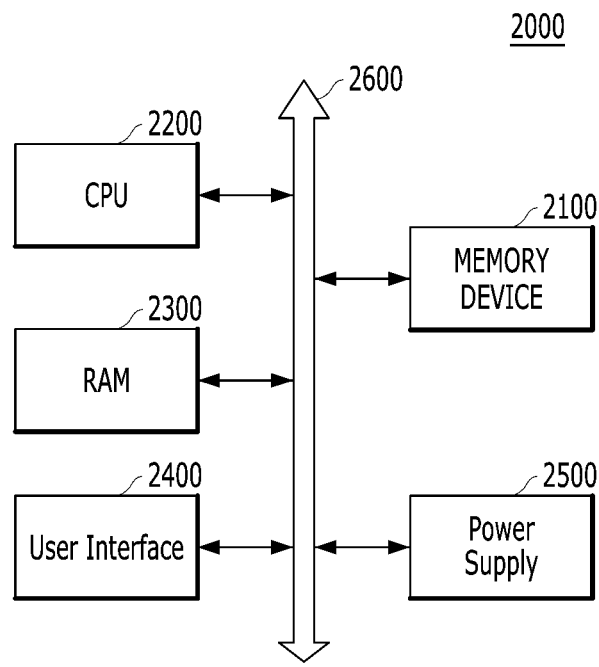
FIGS. 7A and 7B are block diagrams illustrating a configuration of computing systems according to embodiments of the present invention.

FIG. 7A is a block diagram illustrating a configuration of a computing system 2000 according to an embodiment of the present invention. Hereinafter, duplicate descriptions will be omitted below. Referring to FIG. 7A, a computing system 2000 according to an embodiment of the present invention may include a memory device 2100, CPU 2200, RAM 2300, user interface 2400, power supply 2500, and system bus 2600, and the like. The memory device 2100 may store data provided through the user interface 2400 and data processed by the CPU 2200. In addition, the memory device 2100 may be electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, the function of the controller may be performed by the CPU 2200, the RAM 2300, or the like. Here, the memory device 2100 may include a nonvolatile memory. Also, the memory device 2100 may include the resistance patterns of a semiconductor device described with reference to FIG. 1. The computing system 2000 may include a computer, Ultra Mobile PC (UMPC), workstation, netbook, Personal Digital Assistants (PDA), portable computer, web tablet, wireless phone, mobile phone, smart phone, e-book, PMP (Portable Multimedia Player), portable game console, navigation device, black box, digital camera, three-dimensional television, digital audio recorder, digital audio player, digital picture recorder, digital picture player, digital video recorder, digital video player, one of the devices that can transmit and receive information in a wireless environment, one of the various electronic devices that make up a home network, one of the various electronic devices that make up a computer network, one of the various electronic devices that make up a telematics network, or a RFID device. The performance of the computing system 2000 may also be improved because the computing system 2000 according to an embodiment of the present invention includes the memory device 2100 with improved performance.

Figure 7B:
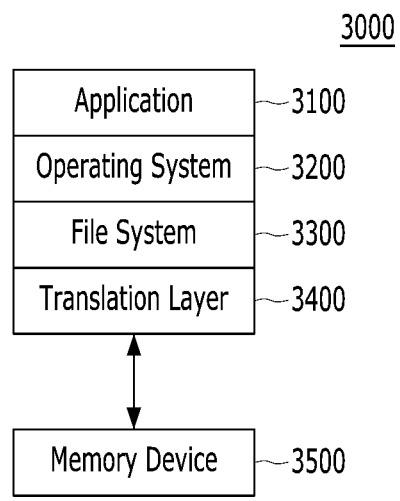

FIG. 7B is a block diagram illustrating a computing system 3000 according to an embodiment of the present invention. Referring to FIG. 7B, a computing system 3000 according to an embodiment of the present invention may include a software layer including an operating system 3200, an application 3100, a file system 3300, a translation layer 3400, and the like. In addition, the computing system 3000 may include a hardware layer such as a memory device 3500. The operating system 3200 may manage software and hardware resources of the computing system 3000 and may control the central processing unit to execute a program. The application 3100 may include various application programs executed by the computing system 3000. For example, the application 3100 may include a utility software executed by the operating system 3200. The file system 3300 refers to a logical structure for managing data, files, and the like existing in the computing system 3000. The file system 3300 may organize the files or data to be stored in the memory device 3500 according to rules. The file system 3300 may be determined depending on the operating system 3200 used for the computing system 3000. For example, when the operating system 3200 is a Windows series of Microsoft Corporation, the file system 3300 may include a File Allocation Table (FAT), an NT file system (NTFS), or the like. In addition, when the operating system 3200 is a Unix/Linux series, the file system 3300 may include an Extended File System (EXT), a Unix File System (UFS), a Journaling File System (JFS), or the like. Although the operating system 3200, the application 3100, and the file system 3300 are described in separate blocks, but the application 3100 and the file system 3300 may be included in the operating system 3200. The translation layer 3400 may translate an address into a format suitable for the memory device 3500 in response to a request from the file system 3300. For example, the translation layer 3400 may convert a logical address generated by the file system 3300 into a physical address of the memory device 3500. Here, mapping information between a logical address and a physical address may be stored in an address translation table. For example, the translation layer 3400 may include a Flash Translation Layer (FTL), a Universal Flash Storage Link Layer (ULL), and the like. The memory device 3500 may include a nonvolatile memory. Also, the memory device 3500 may include the resistance patterns of a semiconductor device described with reference to FIG. 1. The performance of the computing system 3000 may be improved because the computing system 3000 according to an embodiment of the present invention includes the memory device 3500 with improved performance.

While the present invention has been described with respect to the specific embodiments, it will be apparent to those skilled in the art that various changes and modifications may be made without departing from the spirit and scope of the invention as defined in the following claims.

What is claimed is:
1. A semiconductor device, comprising:
a first resistance chain including first upper resistance segments, first resistance via plugs, and first lower resistance segments;
a second resistance chain including second upper resistance segments, second resistance via plugs, and second lower resistance segments; and
a third resistance chain including third upper resistance segments, third resistance via plugs, and third lower resistance segments,
wherein:
each of the first upper resistance segments has a first upper effective resistance distance,
each of the second upper resistance segments has a second upper effective resistance distance,
each of the third upper resistance segments has a third upper effective resistance distance,
the first upper effective resistance distance is equal to the third upper effective resistance distance, and the second upper effective resistance distance is an N times greater than the first upper effective resistance distance, where the N is a positive integer greater than one.

2. The semiconductor device of claim 1, wherein:
each of the first lower resistance segments has a first lower effective resistance distance,
each of the second lower resistance segments has a second lower effective resistance distance,
each of the third lower resistance segments has a third lower effective resistance distance,
the first lower effective resistance distance is equal to the second lower effective resistance distance, and
the third lower effective resistance distance is an M times greater than the first lower effective resistance distance, where the M is a positive integer greater than one.

3. The semiconductor device of claim 2, wherein:
each of the first resistance via plugs has a first via effective resistance distance,
each of the second resistance via plugs has a second via effective resistance distance,
each of the third resistance via plugs has a third via effective resistance distance, and
the first via effective resistance distance, the second via effective resistance distance, and the third via effective resistance distance are a same.

4. The semiconductor device of claim 1, wherein:
a total number of the first upper resistance segments of the first resistance chain, a total number of the second upper resistance segments of the second resistance chain, and a total number of the third upper resistance segments of the third resistance chain are a same,
a total number of the first lower resistance segments of the first resistance chain, a total number of the second lower resistance segments of the second resistance chain, and a total number of the third lower resistance segments of the third resistance chain are a same, and
a total number of the first resistance via plugs of the first resistance chain, a total number of the second resistance via plugs of the second resistance chain, and a total number of the third resistance via plugs of the third resistance chain are a same.

5. The semiconductor device of claim 1, further comprising:
a first front pad, and a first front switch electrically connecting the first front pad to the first resistance chain;
a second front pad, and a second front switch electrically connecting the second front pad to the second resistance chain;
a third front pad, and a third front switch electrically connecting the third front pad to the third resistance chain;
a first end pad, and a first end switch electrically connecting the first end pad to the first resistance chain;
a second end pad, and a second end switch electrically connecting the second end pad to the second resistance chain; and
a third end pad, and a third end switch electrically connecting the third end pad to the third resistance chain.

6. The semiconductor device of claim 5, further comprising:
a first end via electrically connecting the first end pad and the first end switch;
a first end switch contact electrically connecting the first end switch and the first resistance chain;
a second end via electrically connecting the second end pad and the second end switch;
a second end switch contact electrically connecting the second end switch and the second resistance chain;
a third end via electrically connecting the third end pad and the third end switch;
a third end switch contact electrically connecting the third end switch and the third resistance a first front via electrically connecting the first front pad and the first front switch;
a first front switch contact electrically connecting the first front switch and the first resistance chain:
a second front via electrically connecting the second front pad and the second front switch;
a second front switch contact electrically connecting the second front switch and the second resistance chain;
a third front via electrically connecting the third front pad and the third front switch; and
a third front switch contact electrically connecting the third front switch and the third resistance chain.

7. The semiconductor device of claim 1, wherein:
the first upper resistance segments, the second upper resistance segments, and the third upper resistance segments have the same cross-sectional area and the same material;
the first lower resistance segments, the second lower resistance segments, and the third lower resistance segments have the same cross-sectional area and the same material; and
the first resistance via plugs, the second resistance via plugs, and the third resistance via plugs have the same cross-sectional area and the same material.

8. The semiconductor device of claim 1, wherein:
the first upper resistance segments, the second upper resistance segments, and the third upper resistance segments have a segment shape formed at an upper level and extending horizontally,
the first lower resistance segments, the second lower resistance segments, and the third lower resistance segments have a segment shape formed at a lower level and extending horizontally, and
the first resistance via plugs, the second resistance via plugs, and the third resistance via plugs have a pillar shape extending vertically to electrically connect the first to third upper resistance segments and the first to third lower resistance segments, respectively.

9. A semiconductor device, comprising:
a first resistance chain including first upper resistance segments, first resistance via plugs, and first lower resistance segments;
a second resistance chain including second upper resistance segments, second resistance via plugs, and second lower resistance segments; and
a third resistance chain including third upper resistance segments, third resistance via plugs, and third lower resistance segments,
wherein:
a total number of the first upper resistance segments, a total number of the second upper resistance segments, and a total number of the third upper resistance segments are a same,
a total number of the first lower resistance segments, a total number of the second lower resistance segments, and a total number of the third lower resistance segments are a same, and a total number of the first resistance via plugs, a total number of the second resistance via plugs, and a total number of the third resistance via plugs are a same,
wherein:
each of the second upper resistance segments is an N times longer than each of the first upper resistance segments, where the N is a positive integer,
each of the third lower resistance segments is an M times longer than each of the first lower resistance segments, where the M is a positive integer.

10. The semiconductor device of claim 9, wherein:
each of the first upper resistance segments has a first upper effective resistance distance,
each of the second upper resistance segments has a second upper effective resistance distance,
each of the third upper resistance segments has a third upper effective resistance distance,
the first upper effective resistance distance is equal to the third upper effective resistance distance, and
the second upper effective resistance distance is twice the first upper effective resistance distance.

11. The semiconductor device of claim 9, wherein:
each of the first lower resistance segments has a first lower effective resistance distance,
each of the second lower resistance segments has a second lower effective resistance distance,
each of the third lower resistance segments has a third lower effective resistance distance,
the first lower effective resistance distance is equal to the second lower effective resistance distance, and
the third lower effective resistance distance is twice the first lower effective resistance distance.

12. The semiconductor device of claim 9, wherein:
each of the first resistance via plugs has a first via effective resistance distance, and
each of the second resistance via plugs has a second via effective resistance distance,
each of the third resistance via plugs has a third via effective resistance distance, and
the first via effective resistance distance, the second via effective resistance distance, and the third via effective resistance distance are a same.

13. A semiconductor device, comprising:
a first resistance chain including first upper resistance segments, first resistance via plugs, and first lower resistance segments;
a second resistance chain including second upper resistance segments, second resistance via plugs, and second lower resistance segments; and
a third resistance chain including third upper resistance segments, third resistance via plugs, and third lower resistance segments,
wherein:
each of the first upper resistance segments has a first upper effective resistance distance,
each of the first resistance via has a first via effective resistance distance,
each of the first lower resistance segments has a first lower effective resistance distance,
each of the second upper resistance segments has a second upper effective resistance distance,
each of the second resistance via plugs has a second via effective resistance distance,
each of the second lower resistance segments has a second lower effective resistance distance,
each of the third upper resistance segments has a third upper effective resistance distance,
each of the third resistance via plugs has a third via effective resistance distance, and
each of the third lower resistance segments has a third lower effective resistance distance,
wherein:
a total length of the second resistance chain is longer than a total length of the first resistance chain by a sum of the first upper effective resistance distances of the first upper resistance segments, and
a total length of the third resistance chain is longer than the total length of the first resistance chain by a sum of the first lower effective resistance distances of the first lower resistance segments.

14. The semiconductor device of claim 13, wherein:
a sum of the first upper effective resistance distances is equal to a sum of the third upper effective resistance distances; and
a sum of the first lower effective resistance distances and is equal to a sum of the second lower effective resistance distances.

15. The semiconductor device of claim 1, wherein:
a total effective resistance distance of the first upper resistance segments is a same as a total effective resistance distance of the third upper resistance segments,
a total effective resistance distance of the first lower resistance segments is a same as a total effective resistance distance of the second lower resistance segments,
a total effective resistance distance of the second upper resistance segment is twice a total effective resistance distance of the first upper resistance segments, and
a total effective resistance distance of the third lower resistance segment is twice a total effective resistance distance of the first lower resistance segments.

16. The semiconductor device of claim 1, wherein:
a length of each of the first upper resistance segments and a length of each of the third upper resistance segments are a same,
a length of each of the first lower resistance segments and a length of each of the second lower resistance segments are a same,
a length of each of the second upper resistance segments is the N time greater than a length of each of the first upper resistance segments, and
a length of each of the third lower resistance segments is an M times greater than a length of each of the first lower resistance segments, where the M is a positive integer over 1.

17. The semiconductor device of claim 9, wherein:
an effective resistance of each of the second upper resistance segments is an N times greater than an effective resistance of each of the first upper resistance segments, where the N is a positive integer over 1, and
an effective resistance of each of the third lower resistance segments is an M times greater than an effective resistance of each of the first lower resistance segments, where the M is a positive integer over 1.

18. The semiconductor device of claim 9, wherein:
an effective resistance distance of each of the first upper resistance segments is a same as an effective resistance distance of each of the third upper resistance segments, and
an effective resistance distance of each of the first lower resistance segments is a same as an effective resistance distance of each of the second lower resistance segments.

19. The semiconductor device of claim 13, wherein:
each of the second upper resistance segments is an N times longer than each of the first upper resistance segments, where the N is a positive integer,
each of the third lower resistance segments is an M times longer than each of the first lower resistance segments, where the M is a positive integer.

20. The semiconductor device of claim 13, wherein:
a length of each of the first upper resistance segments and a length of each of the third upper resistance segments are a same,
a length of each of the first lower resistance segments and a length of each of the second lower resistance segments are a same,
a length of each of the second upper resistance segments is an N time greater than a length of each of the first upper resistance segments, where the N is a positive integer over 1, and
a length of each of the third lower resistance segments is an M times greater than a length of each of the first lower resistance segments, where the M is a positive integer over 1.

\* \* \* \* \*